(12) United States Patent
Watanabe et al.

(10) Patent No.: US 8,716,839 B2
(45) Date of Patent: May 6, 2014

(54) SEMICONDUCTOR DEVICE MOUNTING STRUCTURE, METHOD OF MANUFACTURING THE SAME, AND ELECTRONIC APPARATUS

(71) Applicant: Fujitsu Limited, Kawasaki (JP)

(72) Inventors: Manabu Watanabe, Yokohama (JP); Masateru Koide, Kawasaki (JP); Kenji Fukuzono, Kawasaki (JP); Takashi Kanda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/896,739

(22) Filed: May 17, 2013

(65) Prior Publication Data

US 2013/0341767 A1    Dec. 26, 2013

(30) Foreign Application Priority Data

Jun. 21, 2012  (JP) ................... 2012-140257

(51) Int. Cl.
*H01L 23/544*   (2006.01)
*H01L 29/40*    (2006.01)
*H01L 29/06*    (2006.01)

(52) U.S. Cl.
USPC ............................ 257/622; 257/620; 257/621

(58) Field of Classification Search
CPC ........................... H01L 2224/02; H01L 23/34
USPC .................. 257/618–622, E23.001, E23.003; 361/748, 783
See application file for complete search history.

(56) References Cited

U.S. PATENT DOCUMENTS

| | | | |
|---|---|---|---|
| 2008/0151511 A1* | 6/2008 | Martinson et al. | 361/748 |
| 2008/0222885 A1 | 9/2008 | Kanda | |
| 2012/0206903 A1* | 8/2012 | Kang et al. | 362/97.1 |
| 2012/0236230 A1* | 9/2012 | Nakahama et al. | 349/62 |

FOREIGN PATENT DOCUMENTS

| | | |
|---|---|---|
| JP | 07-221212 A | 8/1995 |
| JP | 2003-209336 A | 7/2003 |
| JP | 2008-227310 A | 9/2008 |

* cited by examiner

*Primary Examiner* — Jessica Stultz
*Assistant Examiner* — Sheikh Maruf
(74) *Attorney, Agent, or Firm* — Squire Sanders (US) LLP

(57) ABSTRACT

A semiconductor device mounting structure includes: a substrate with an opening provided therein; a frame member with a frame body and a protruding portion that protrudes from the frame body, the frame body being formed and accommodated in a groove around the opening; a coreless substrate provided above the substrate and supported by the protruding portion of the frame member; and semiconductor elements provided on the coreless substrate.

6 Claims, 9 Drawing Sheets

SEMICONDUCTOR DEVICE MOUNTING STRUCTURE, METHOD OF MANUFACTURING THE SAME, AND ELECTRONIC APPARATUS

CROSS-REFERENCE TO RELATED APPLICATION

This application is based upon and claims the benefit of priority of the prior Japanese Patent Application No. 2012-140257, filed on Jun. 21, 2012, the entire contents of which are incorporated herein by reference.

FIELD

The embodiment discussed herein is related to a structure for mounting a semiconductor device and a system board, a method of manufacturing a semiconductor device mounting structure, and an electronic apparatus.

BACKGROUND

In recent years, with increasingly higher functionality of information apparatus, there is a demand for higher mounting density and higher performance of semiconductor devices mounted on such information apparatus. One of the semiconductor device mounting techniques that address such a demand is a mounting structure using a buildup substrate.

In the semiconductor device mounting structure using a buildup substrate, the buildup substrate is a rigid substrate including a core layer of glass epoxy resin or the like and wiring layers formed on the upper and lower surfaces of the core layer, for example. The upper and lower wiring layers are connected to each other by vias extending through the core layer. A plurality of semiconductor elements such as a CPU and a memory element are mounted on the buildup substrate, forming a semiconductor device. This semiconductor device is mounted above a system board built in a server, supercomputer, or other information apparatus via a plurality of mounting terminals formed on the rear surface of the buildup substrate.

To reduce the inductance component that increases high-frequency noise generated by the semiconductor device, there is a mounting structure in which a plurality of chip components such as capacitors that remove the high-frequency noise are mounted on the rear surface of the system board directly below the semiconductor device. The closer to the semiconductor device the chip components are, the more effectively the high-frequency noise is removed. There is accordingly another mounting structure in which an opening is provided in the system board in an area above which the semiconductor device is mounted and a plurality of chip components such as capacitors are provided inside the opening on the rear surface of the buildup substrate of the semiconductor device.

The following is reference documents:
[Document 1] Japanese Laid-open Patent Publication No. 2008-227310.

SUMMARY

According to an aspect of the invention, a semiconductor device mounting structure includes: a substrate with an opening provided therein; a frame member with a frame body and a protruding portion that protrudes from the frame body, the frame body being formed and accommodated in a groove around the opening; a coreless substrate provided above the substrate and supported by the protruding portion of the frame member; and semiconductor elements provided on the coreless substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Hereinafter, an embodiment of a semiconductor device mounting structure according to the present disclosure will be described with reference to the drawings.

Figure 1:
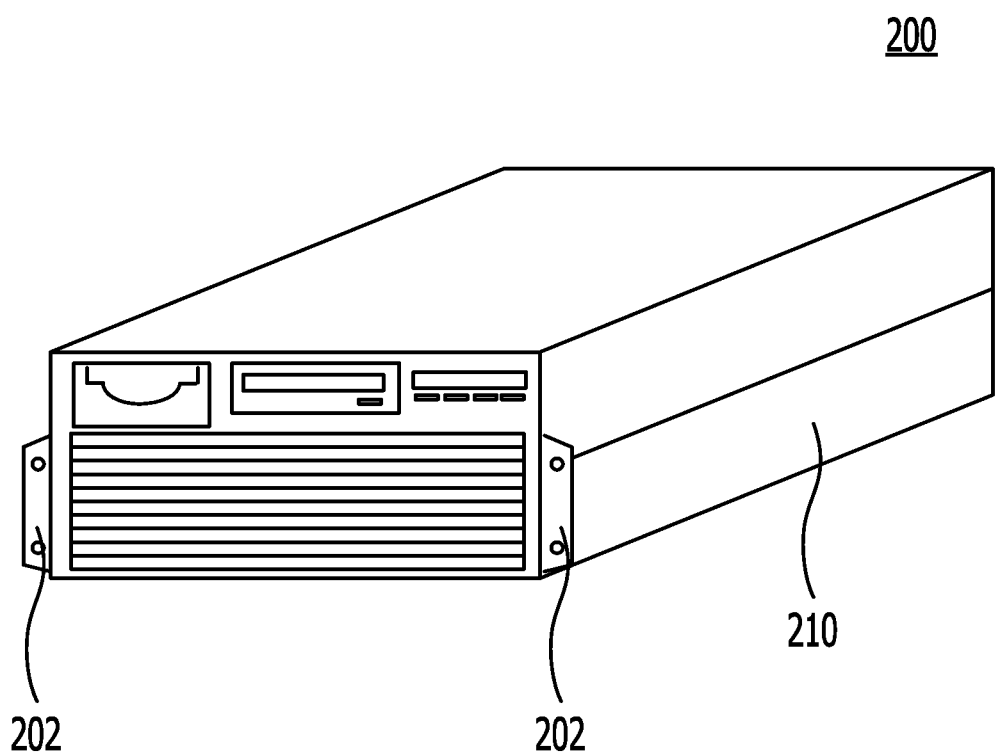
FIG. 1 illustrates an exemplary electronic apparatus in which a semiconductor device according to this embodiment is installed.

First, FIG. 1 illustrates a server 200 as an exemplary electronic apparatus in which a semiconductor device according to this embodiment is installed. The server 200 is screwed to a rack (not illustrated) via a pair of attachment members 202 and contains in a housing 210 a system board having a semiconductor device mounted thereon.

The electronic apparatus having a semiconductor device mounted therein is not limited to the rack-mounted server illustrated in FIG. 1; it may be any one of supercomputers, PCs, personal digital assistants (PDA), mobile phones, digital cameras, testers, and so on.

Figure 2A:
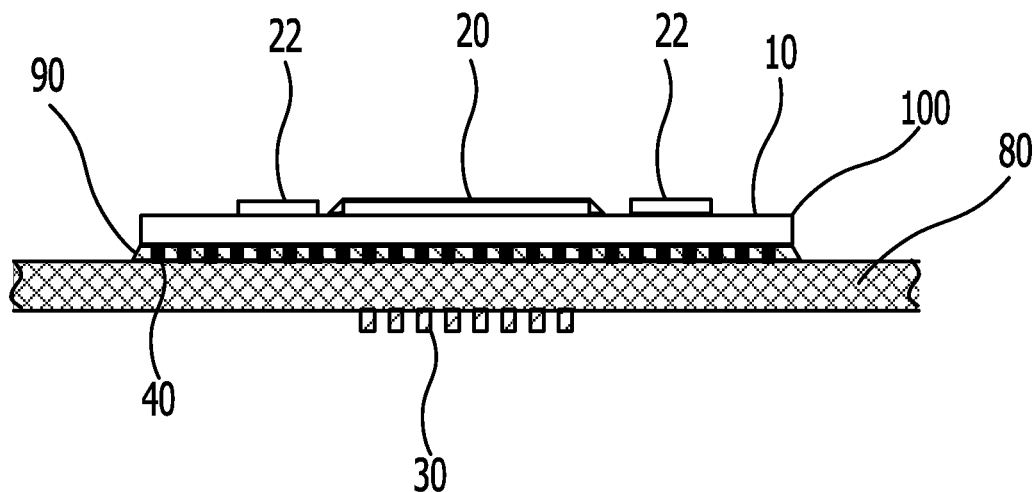
FIGS. 2A and 2B illustrate semiconductor device mounting structures using buildup substrates.

Referring next to FIG. 2A, a structure for mounting a semiconductor device 100 using a buildup substrate 10 will be described as a comparative example. The buildup substrate 10 is a rigid substrate including a core layer of glass epoxy resin or the like and wiring layers formed on the upper and lower surfaces thereof. The upper and lower wiring layers are electrically connected to each other by vias extending through the core layer.

The semiconductor device 100 includes a plurality of semiconductor elements such as CPU 20 and a memory element and other peripheral elements 22 mounted on the buildup substrate 10.

The semiconductor device 100 is mounted above a system board 80 built in an information apparatus via a plurality of mounting terminals 40 provided on the rear surface of the buildup substrate 10 and a connecting portion between the semiconductor device 100 and the system board 80 is filled with an adhesive 90 of resin or the like.

On the rear surface of the system board 80 with the semiconductor device 100 mounted, a plurality of chip components 30 such as capacitors are provided to remove high frequency noise generated in the electrical signal passing through the system board 80. The chip components 30 are disposed on the rear surface of the system board 80 directly below the semiconductor device 100, not around the semiconductor device 100, because an inductance component that increases the high-frequency noise generated by the semiconductor device 100 is more effectively reduced when the chip components 30 are closer to the semiconductor device 100. With increasingly higher mounting density and performance of semiconductor devices, however, the mounting structure illustrated in FIG. 2A may not effectively remove the high-frequency noise generated by the semiconductor device 100.

Figure 2B:
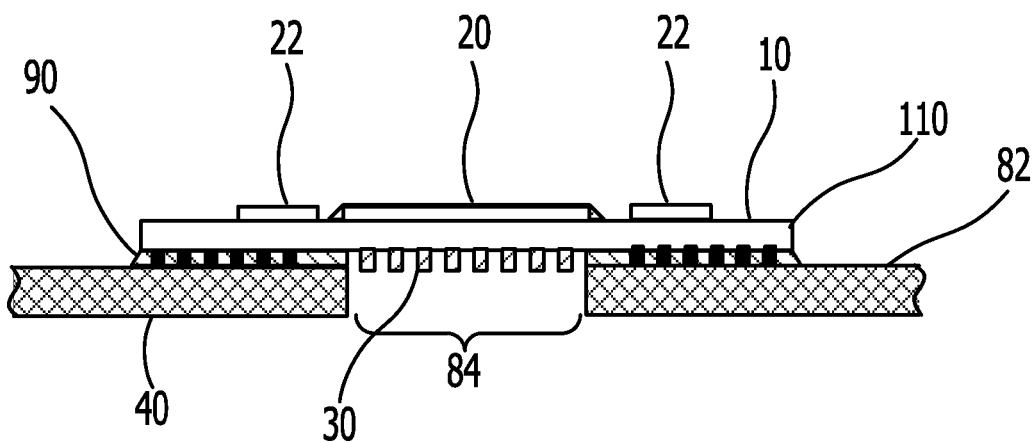

Referring next to FIG. 2B, an exemplary semiconductor device mounting structure using a buildup substrate to remove higher-frequency noise will be described as a comparative example. In the semiconductor device mounting structure in FIG. 2B, a system board 82 has an opening 84 in an area above which a semiconductor device 110 is mounted. A plurality of chip components 30 such as capacitors are provided inside the opening 84 on the rear surface of the buildup substrate 10 of the semiconductor device 110. Accordingly, since the chip components 30 are closer to the semiconductor device 110 than in the mounting structure in FIG. 2A, the inductance component that increases high-frequency noise may further be reduced.

If much higher mounting density and performance are desired for semiconductor devices installed in information apparatus in the future, however, the inductance components of, for example, plated through holes extending through the core layer may possibly increase noise even with the above mounting structure using the buildup substrate.

The inventor has considered using a coreless substrate, which has no core layer, instead of the buildup substrate 10 used in the mounting structure in FIG. 2B to reduce inductance components of the plated through holes extending through the core layer of the buildup substrate 10. The coreless substrate is a thin flexible wiring board formed from a stack of layers including a plurality of insulating layers and a plurality of wiring layers, with no core layer.

FIGS. 3A to 3D illustrate a process of manufacturing a semiconductor device mounting structure using a coreless substrate.

Figure 3A:
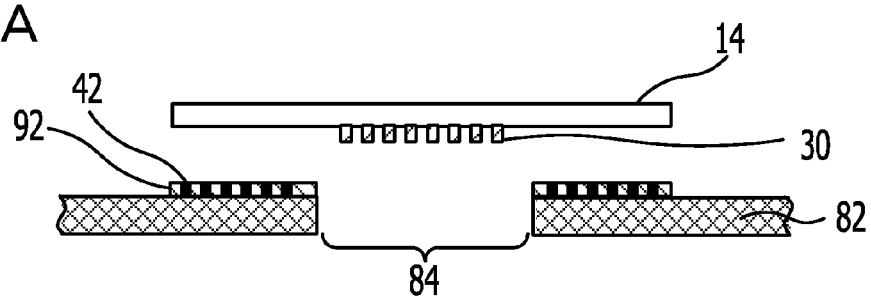
FIGS. 3A to 3D illustrate a problem of a semiconductor device mounting structure using a coreless substrate.

Referring first to FIG. 3A, a system board 82 has an opening 84 formed beforehand in an area above which a semiconductor device 120 is mounted. An adhesive sheet 92 having a thickness of 100 μm, for example, is bonded around the opening 84 to mount the semiconductor device 120 thereon. The adhesive sheet 92 has a plurality of through holes formed therein, which are filled with conductive ink 42 that serves as connection electrodes for the semiconductor device 120. The coreless substrate 14 having a plurality of chip components 30 formed on the rear surface thereof is aligned with and mounted on the adhesive sheet 92.

Figure 3B:
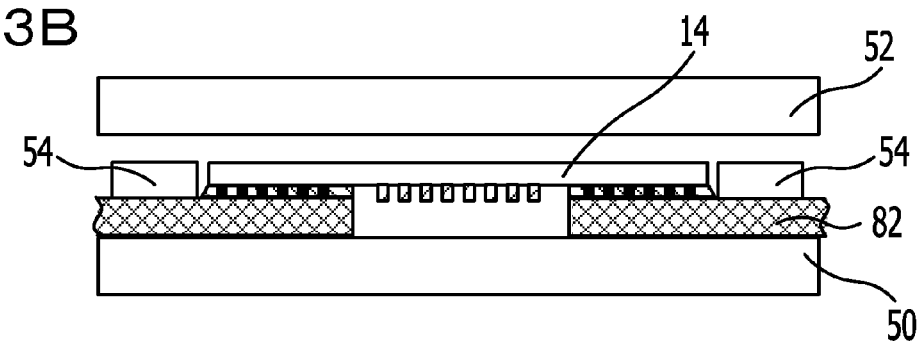

Referring next to FIG. 3B, the system board 82 having the coreless substrate 14 mounted thereon is placed on a stage 50 of a pressure bonding machine. A spacer 54 is provided on the system board 82 around the coreless substrate 14 to adjust the spacing between the coreless substrate 14 and the system board 82.

Figure 3C:
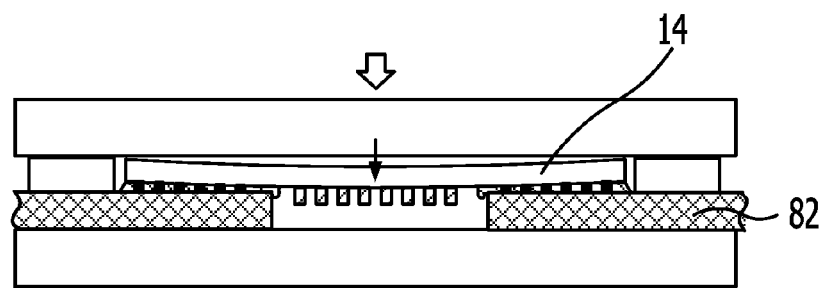

Referring next to FIG. 3C, while the stage 50 of the pressure bonding machine is in heated state, a heated upper die 52 of the pressure bonding machine presses against the upper surface of the coreless substrate 14 to pressure-bond the coreless substrate 14 to the system board 82. This would cause the coreless substrate 14 to thermally expand and warp downward by gravity inside the opening 84 and also cause the adhesive sheet 92 around the deep portion of the opening 84 to melt and flow into the opening 84. If the temperature is returned to normal and the adhesive sheet 92 is solidified in this state, the coreless substrate 14 would be fixedly warped downward inside the opening 84. Also, the conductive ink 42 that electrically connects the coreless substrate 14 to the system board 82 would become significantly different in height between the outer periphery of the coreless substrate 14 and the vicinity of the opening 84. The amount of warpage of the coreless substrate 14 would reach 118 μm at maximum at the center of the opening 84, which would significantly impair the flatness of the coreless substrate 14. Depending on the amount of warpage, it would become difficult to mount the plurality of semiconductor elements such as CPU 20 and a memory element and other peripheral elements 22 on the warped coreless substrate 14.

Figure 3D:
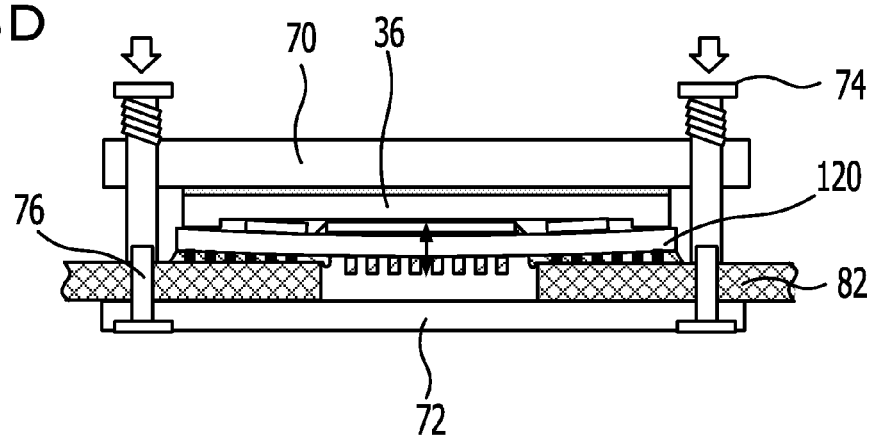

FIG. 3D illustrates the final form in which the semiconductor device 120 with the coreless substrate 14 is mounted on the system board 82. The plurality of semiconductor elements such as CPU 20 and a memory element and other peripheral elements 22 are mounted on the coreless substrate 14, and the CPU 20 and the peripheral elements 22 are covered by a thermal bonding member 36. The semiconductor device 120 and the system board 82 are then placed between a bolster plate 72 disposed on the rear surface of the system board 82 and a heat spreader 70 disposed on the upper surface of the thermal bonding member 36. The heat spreader 70 is fixed by spring nuts 74 and drive screws 76 so as to press against the system board 82. Since the CPU 20 is mounted on the warped coreless substrate 14, the CPU 20 would not adhere well to the thermal bonding member 36.

If the system is operated in this state, heat from the CPU 20 would not be effectively dissipated through the heat spreader 70 and the temperature of the CPU 20 would exceed the rated value. This would cause further thermal expansion and warpage of the coreless substrate 14. The difference in thermal behavior between the ON and OFF states of the system would reach 58.7 μm, for example. The CPU 20 would experience a temperature rise exceeding the rated value and problems would possibly arise in the operation and life of the CPU 20.

As described above, it has been found that it is difficult to simply replace the buildup substrate with a coreless substrate.

Then, the inventor has designed a reliable embodiment in which the coreless substrate 14 is less warped and heat is dissipated well, as described below.

An embodiment of the technique of the present disclosure will now be described with reference to the drawings.

Figure 4A:
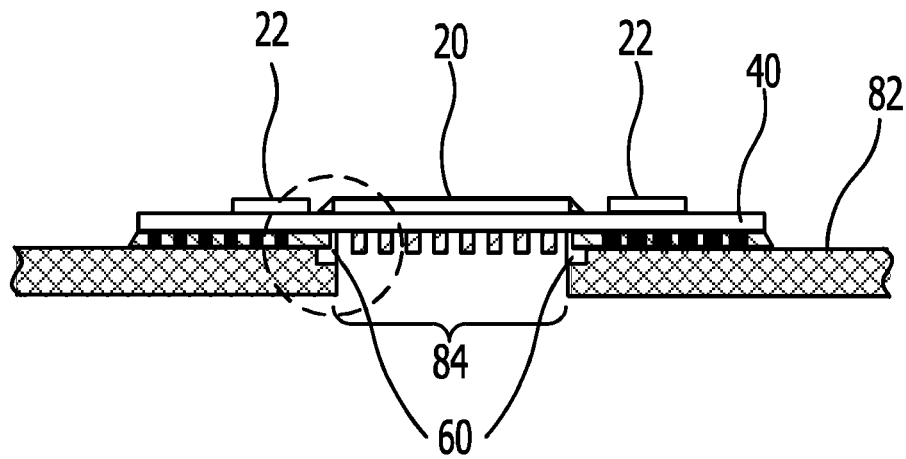
FIGS. 4A and 4B illustrate a semiconductor device mounting structure according to this embodiment.
Figure 4B:
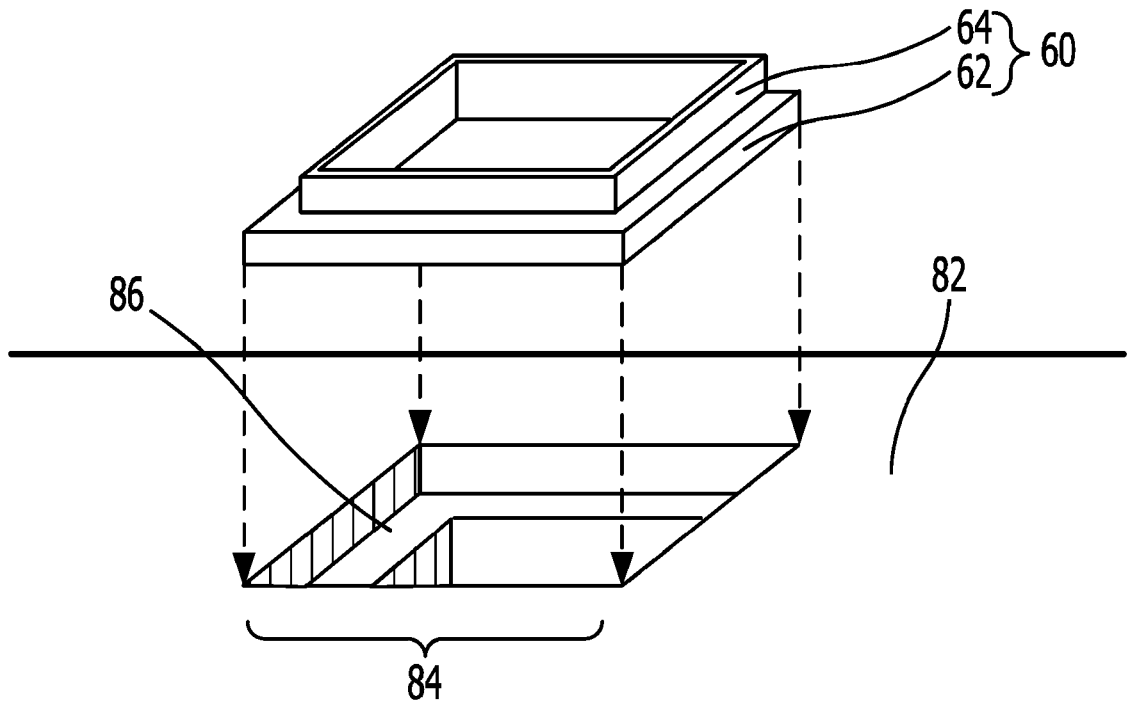

FIGS. 4A and 4B illustrate a semiconductor device mounting structure according to the embodiment in which the disclosed technique is applied.

FIG. 4A is a cross-sectional view of a semiconductor device mounting structure using a coreless substrate; FIG. 4B illustrates the structure of a frame member.

According to this embodiment, a frame member 60 is fit inside the deep portion of an opening 84 formed in a system board 82 in an area in which a semiconductor device 120 is mounted.

Referring to FIG. 4B, the frame member 60 includes a frame body 62, as a base, integral with a protruding portion 64 extending from the top of the frame body 62. The frame member 60 has an L-shaped or laterally reversed L-shaped cross section. The frame body 62 is fit into a groove 86 provided in the deep portion of the opening 84 of the system board 82, and the protruding portion 64 on the top of the frame body 62 is provided inside the opening 84, protruding from the upper surface of the system board 82.

Figure 5A:
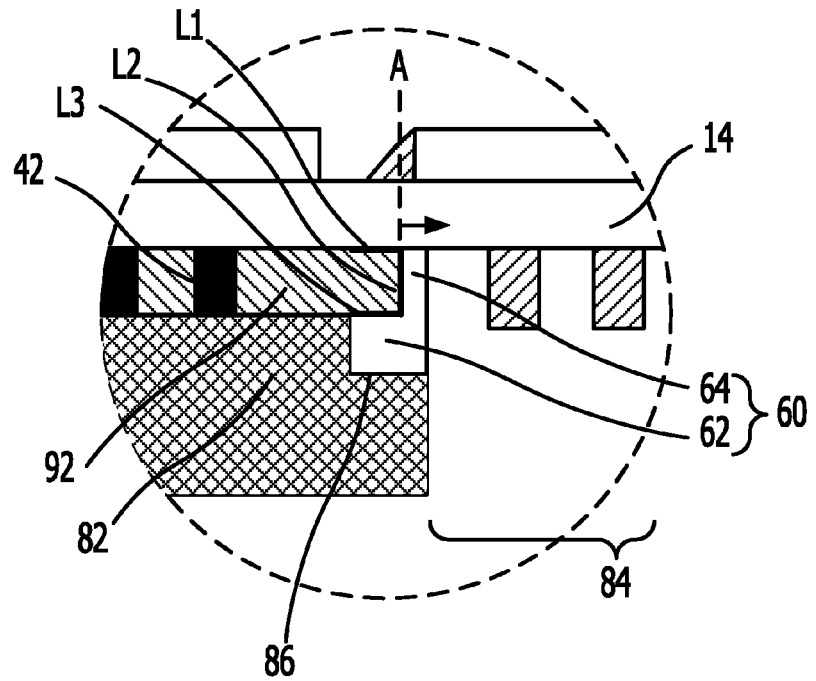
FIGS. 5A and 5B illustrate an effect of a frame member according to this embodiment.
Figure 5B:
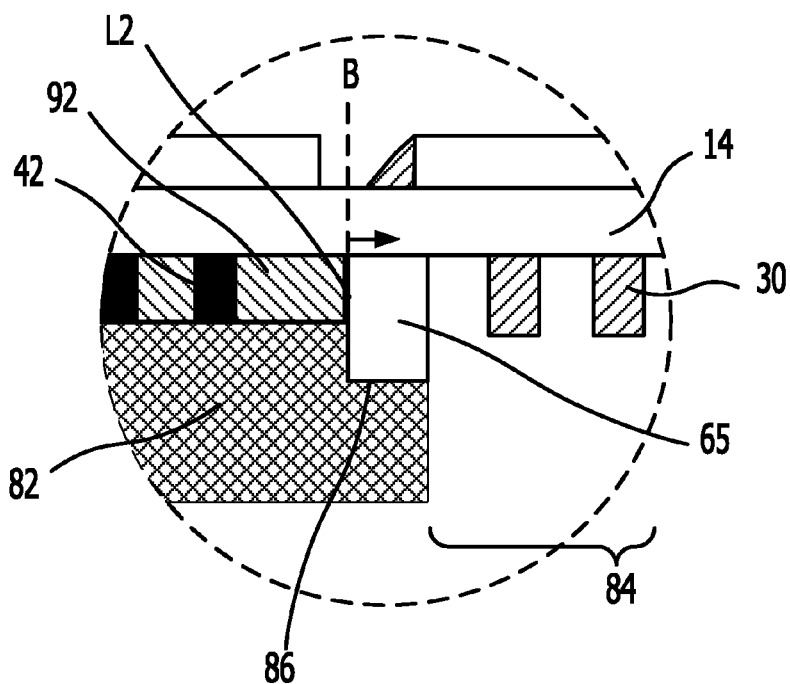

Referring next to FIGS. 5A and 5B, an effect of the frame member will be described. FIG. 5A is an enlarged view of the portion enclosed by a dashed line in FIG. 4A, illustrating an example of the frame member 60 formed from the frame body 62, as a base, integral with the protruding portion 64 extending from the top of the frame body 62. FIG. 5B illustrates another example of the frame member 65 formed only from the frame body, with no protruding portion.

In the example in FIG. 5A, the frame member 60 supports with its protruding portion 64 the coreless substrate 14 from below to reduce the warpage of the coreless substrate 14 and not allow the molten adhesive sheet 92 to flow into the opening 84 in the process of manufacture.

In the example in FIG. 5B as well, the frame member 65 supports with its top end surface the coreless substrate 14 from below to reduce the warpage of the coreless substrate 14 and not allow the molten adhesive sheet 92 to flow into the opening 84 in the process of manufacture. The top end surface of the frame member 65, however, only touches the coreless substrate 14 without being secured thereto by adhesive or the like. If the coreless substrate 14 thermally warps in the process of manufacture of the mounting structure, the coreless substrate 14 would start to warp at point B in FIG. 5B toward the opening 84, resulting in an increased amount of warpage. The frame member 65 is fixed only by surface L2 corresponding to the thickness of the adhesive sheet 92 without being connected to the coreless substrate 14 at all.

In the example in FIG. 5A, the top end surface of the protruding portion 64 of the frame member 60 only touches the coreless substrate 14 without being fixed thereto by adhesive or the like. The coreless substrate 14 is, however, fixed by the adhesive sheet 92 in an area immediately left to point A in FIG. 5A. Even if the coreless substrate 14 thermally warps in the process of manufacture of the mounting structure, the coreless substrate 14 would start to warp only at point A in FIG. 5A toward the opening 84. This may reduce the amount of warpage compared with the example in FIG. 5B in which the coreless substrate 14 starts to warp at point B. The frame member 60 is connected to the coreless substrate 14 at surface L2 corresponding to the thickness of the adhesive sheet 92 and at surfaces L1 and L3 facing each other with the adhesive sheet 92 in between.

Referring next to FIGS. 6A to 6D, 7A to 7C, and 8A to 8C, a method of manufacturing the semiconductor device mounting structure according to this embodiment will be described.

Figure 6A:
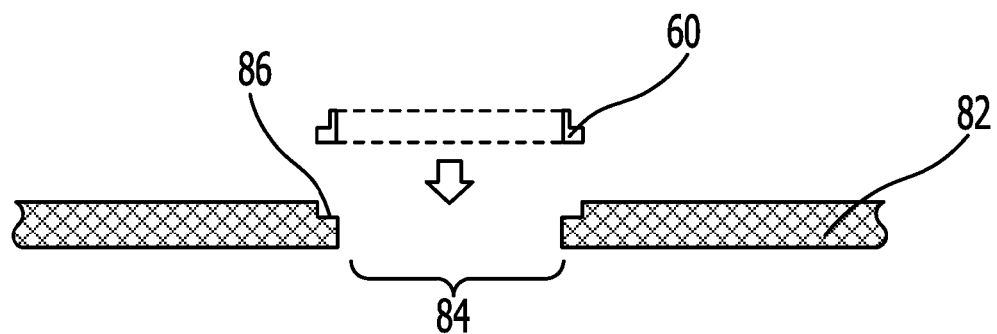
FIGS. 6A to 6D illustrate a method of manufacturing the semiconductor device mounting structure according to this embodiment.

Referring first to FIG. 6A, a system board 82 having an opening 84 of 20 to 30 square millimeters in size, for example, and a frame member 60 are provided.

Figure 6B:
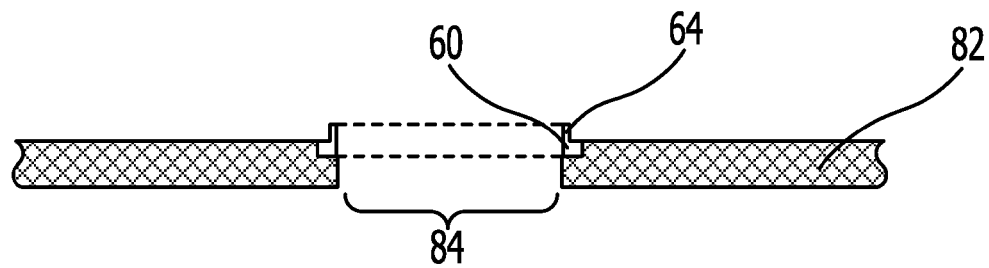

Referring next to FIG. 6B, the frame member 60 is disposed in a groove 86 formed in the deep portion of the opening 84. In this state, only the protruding portion 64 of the frame member 60 protrudes from the upper surface of the system board 82.

Figure 6C:
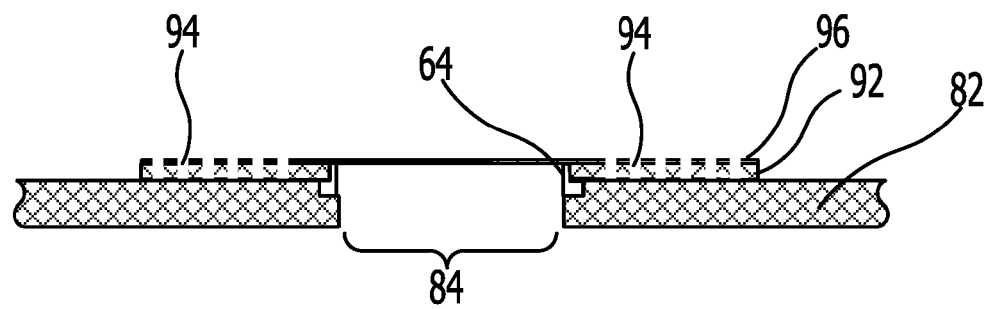

Referring next to FIG. 6C, an adhesive sheet 92 having a plurality of through holes 94 formed therein is bonded to the system board 82 around the protruding portion 64 in an area on which the semiconductor device 120 is to be mounted. The adhesive sheet 92 has a thickness of 100 μm, for example. Then, a PET film 96 made of resin or the like is bonded to the upper surface of the adhesive sheet 92. The PET film 96 has a plurality of through holes formed beforehand at the positions corresponding to the positions of the through holes 94 in the adhesive sheet 92. The PET film 96 is disposed such that it also covers the opening 84 and the protruding portion 64 of the frame member 60.

Figure 6D:
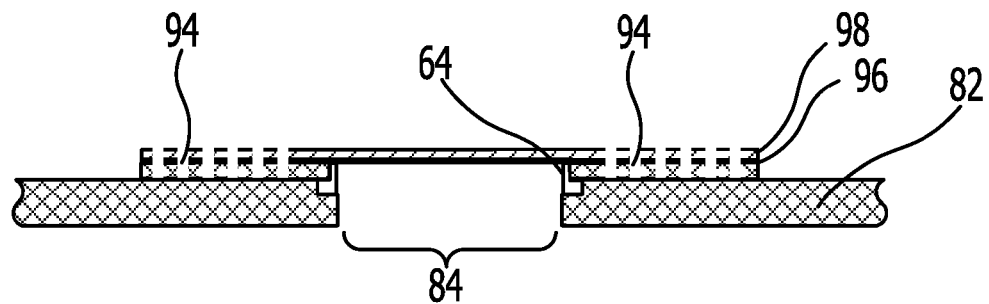

Referring next to FIG. 6D, a metal mask 98 having a plurality of through holes formed at the positions corresponding to the positions of the through holes 94 in the adhesive sheet 92 is provided on the PET film 96.

Figure 7A:
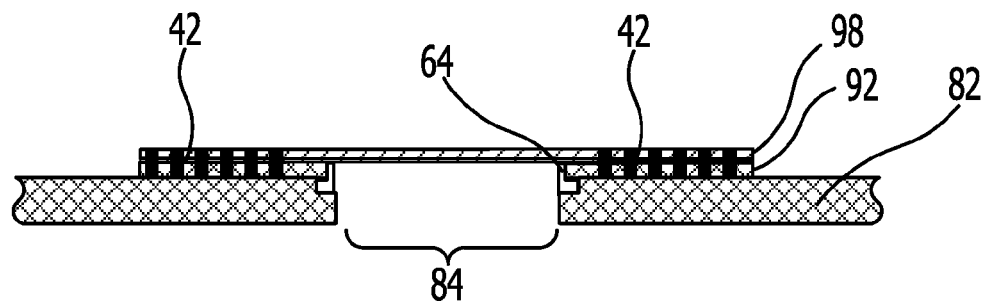
FIGS. 7A to 7C illustrate the method of manufacturing the semiconductor device mounting structure according to this embodiment.

Referring next to FIG. 7A, a conductive ink is poured over the metal mask 98 into the through holes to form a conductive ink 42 as connection terminals within the through holes 94 of the adhesive sheet 92.

Figure 7B:
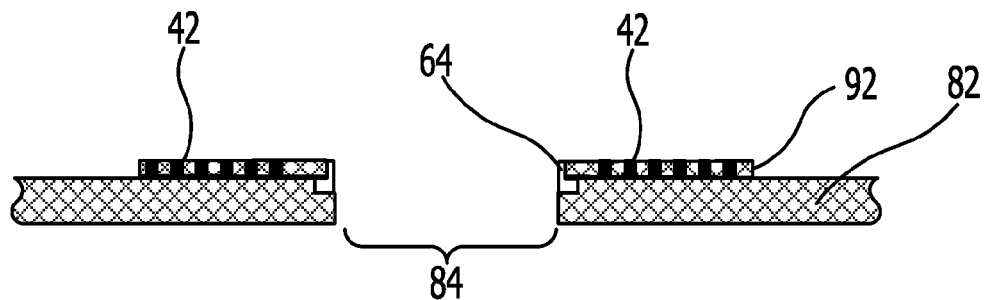

Referring next to FIG. 7B, the metal mask 98 is removed and the PET film 96 is peeled off. A connecting portion is thus completed with connecting terminals formed by the conductive ink 42 within the through holes 94 of the adhesive sheet 92.

Figure 7C:
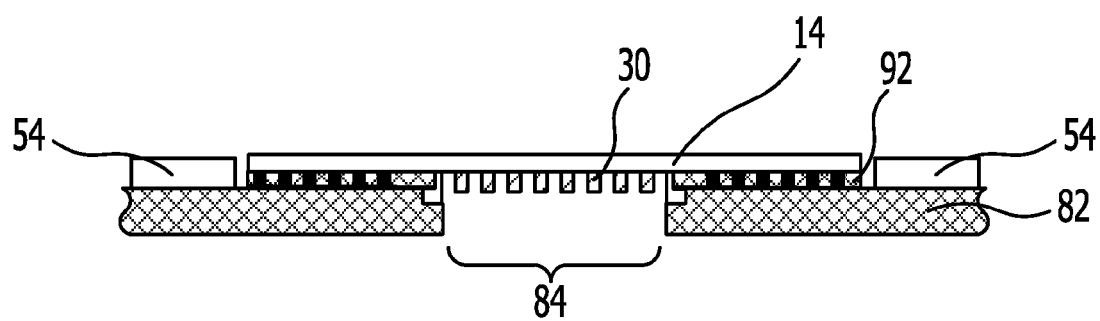

Referring next to FIG. 7C, a coreless substrate 14 having a plurality of chip components 30 mounted beforehand on its rear surface is aligned with and mounted on the adhesive sheet 92. Then, spacers 54 are provided on the system board 82 around the coreless substrate 14 to adjust the spacing between the coreless substrate 14 and the system board 82.

Figure 8A:
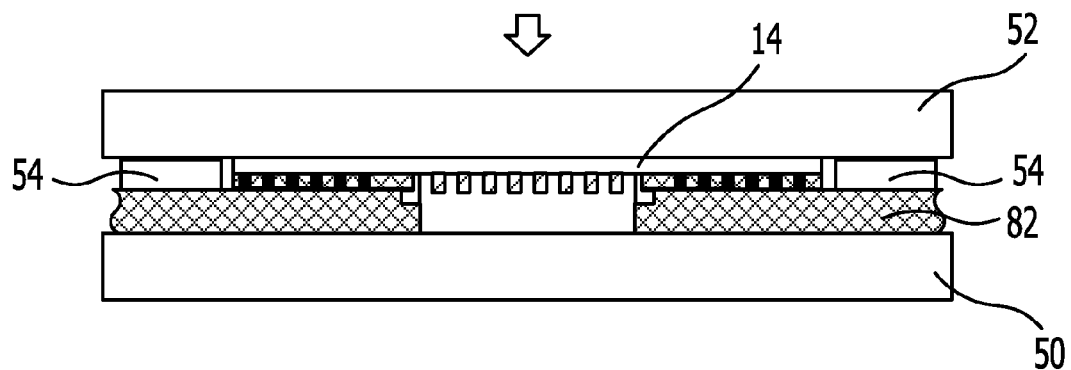
FIGS. 8A to 8C illustrate the method of manufacturing the semiconductor device mounting structure according to this embodiment.

Referring next to FIG. 8A, the system board 82 having the coreless substrate 14 mounted thereon is placed on the stage 50 of a pressure bonding machine. Then, while the stage 50 in the pressure bonding machine is in heated state, a heated upper die 52 in the pressure bonding machine presses against the upper surface of the coreless substrate 14 with a load of 30 to 50 kg/cm, for example, to pressure-bond the coreless substrate 14 to the system board 82. Even if the downward warpage by gravity of the thermally expanded coreless substrate 14 occurs inside the opening 84 in the pressure-bonding process, the warpage of the coreless substrate 14 may substantially be reduced because the coreless substrate 14 is supported by the frame member 60 around the opening 84.

Figure 8B:
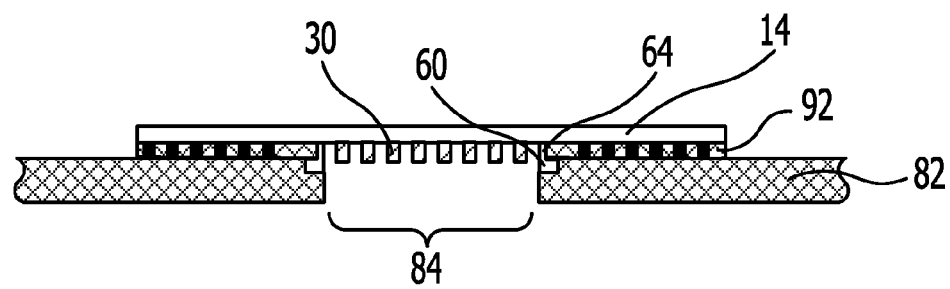

Referring next to FIG. 8B, it is possible to limit the amount of warpage of the coreless substrate 14 to approximately 26 μm at maximum at the center of the opening 84 when the temperature is returned to normal and the adhesive sheet 92 is solidified. Since the molten adhesive sheet 92 around the deep portion of the opening 84 does not flow into the opening 84, the height of the conductive ink 42, which electrically connects the coreless substrate 14 to the system board 82, may be kept uniform over an area extending between the outer periphery of the coreless substrate 14 and the vicinity of the opening 84.

Figure 8C:
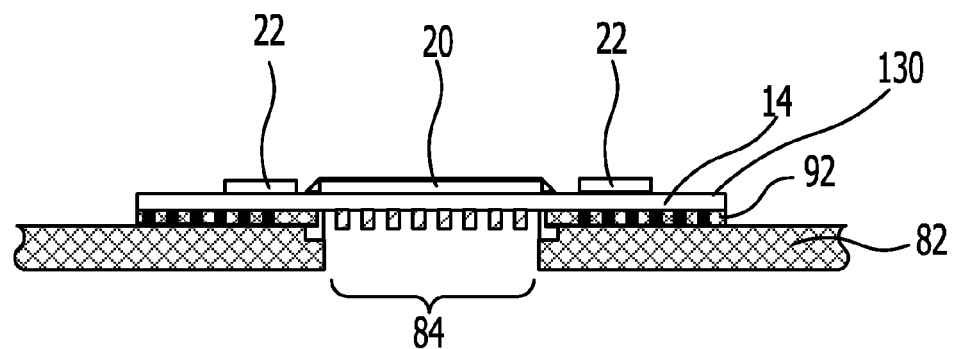

Referring next to FIG. 8C, a plurality of semiconductor elements such as CPU 20 and a memory element and other peripheral elements 22 are mounted on the coreless substrate 14 with an underfill material in between. Since the coreless substrate 14 has experienced little warpage, the upper surfaces of the CPU 20 and peripheral elements 22 may be kept horizontal and thus a semiconductor device 130 with excellent flatness may be obtained.

When the system is operated with this semiconductor device 130 mounted on a system board 82, the heat spreader may easily dissipate heat from the CPU 20 and thus reduce the temperature rise of the CPU 20. This may reduce the warpage of the coreless substrate 14 due to thermal expansion and reduce the difference in thermal behavior between the ON and OFF states of the system to 42.8 μm, for example.

Figure 9A:
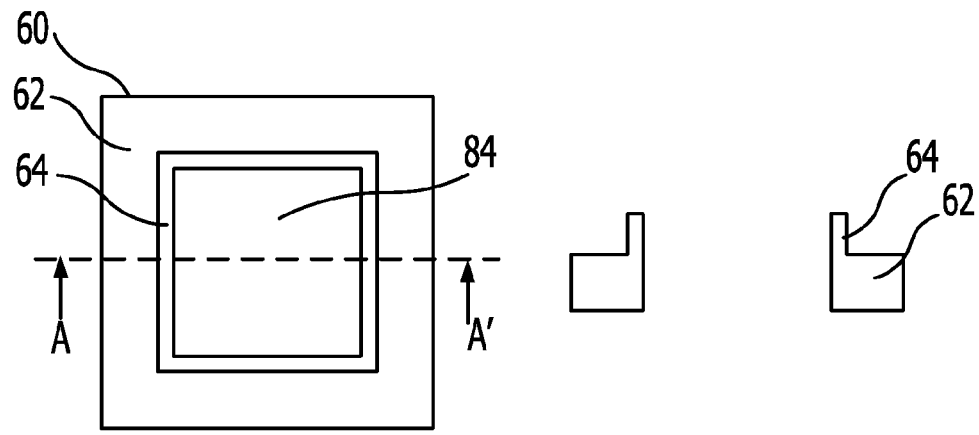
FIGS. 9A to 9C illustrate variations of the frame member according to this embodiment.
Figure 9B:
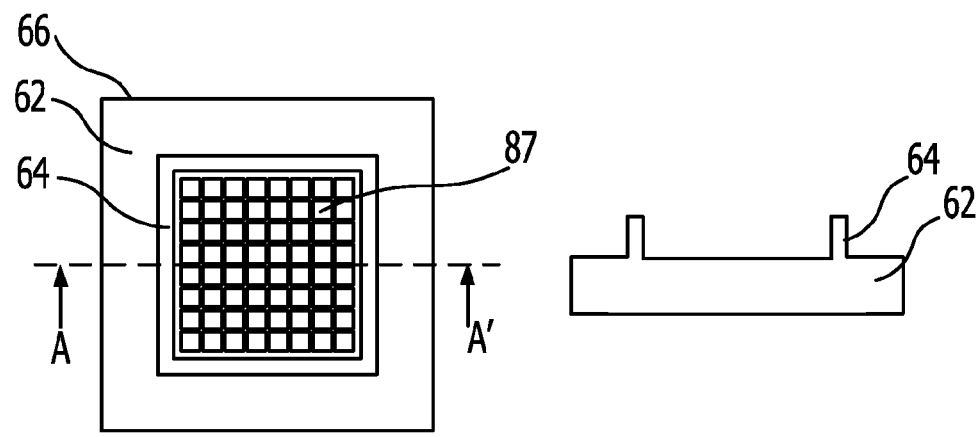
Figure 9C:
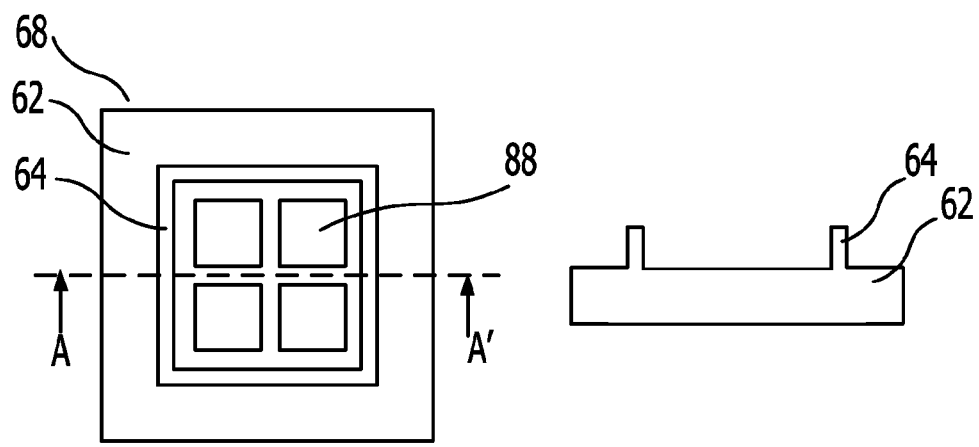

Referring finally to FIGS. 9A to 9C, variations of the frame member 60 used in this embodiment will be described.

FIG. 9A illustrates the frame member 60 used in this embodiment in a plan view and in a cross-sectional view along the line A-A' in the plan view. The frame member 60 in FIG. 9A, which is used in this embodiment, has a widely opened opening 84 such that the frame body 62 of the frame member 60 does not touch the chip components 30 on the bottom surface of the coreless substrate 14.

As illustrated in FIG. 9B, a first variation of the frame member 66 has a plurality of small openings 87. Since the openings 87 are provided at positions corresponding to the positions of the chip components 30 on the bottom surface of the coreless substrate 14, the frame body 62 does not touch the chip components 30.

As illustrated in FIG. 9C, a second variation of the frame member 68 has, for example, four larger openings 88. Since the openings 88 are provided at positions corresponding to the positions of the chip components 30 disposed in respective areas on the bottom surface of the coreless substrate 14, the frame body 62 does not touch the chip components 30.

According to this embodiment, it is possible to dispose chip components on the rear surface of the coreless substrate, so inductance components, which increase high-frequency noise, may be reduced and thus the high-frequency noise may effectively be removed. Furthermore, a reliable semiconductor device mounting structure may be provided because a coreless substrate is less warped in the process of manufacture.

Although the embodiment of the present disclosure has been described above, the present disclosure is not limited to this particular embodiment; it may be modified or changed in various ways within the scope and spirit of the present disclosure defined in the claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A semiconductor device mounting structure comprising:
   a substrate with an opening provided therein;
   a frame member with a frame body and a protruding portion that protrudes from the frame body, the frame body being formed and accommodated in a groove around the opening;
   a coreless substrate provided above the substrate and supported by the protruding portion of the frame member; and
   semiconductor elements provided on the coreless substrate.

2. The semiconductor device mounting structure according to claim 1,
   wherein an upper surface of the frame body is flush with an upper surface of the substrate;
   wherein the protruding portion protrudes from the upper surface of the substrate.

3. The semiconductor device mounting structure according to claim 2,
   wherein the protruding portion is frame-shaped and disposed inside an opening of the frame body.

4. The semiconductor device mounting structure according to claim 1, further comprising:
   a bonding member between the substrate and the coreless substrate.

5. The semiconductor device mounting structure according to claim 1, further comprising:
   chip components on an upper surface of the coreless substrate inside the opening of the substrate.

6. An electronic apparatus comprising:
   a substrate with an opening provided therein;
   a frame member with a frame body and a protruding portion that protrudes from the frame body, the frame body being formed and accommodated in a deep portion of the opening;
   a coreless substrate provided above the substrate and supported by the protruding portion of the frame member; and
   semiconductor elements provided on the coreless substrate.

* * * * *